(12) United States Patent
Pan et al.

(10) Patent No.: US 8,736,293 B2
(45) Date of Patent: May 27, 2014

(54) TEST DEVICE FOR PRINTED CIRCUIT BOARD

(75) Inventors: Jian-Chun Pan, Shenzhen (CN); Hai-Qing Zhou, Shenzhen (CN); Yi-Xin Tu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 169 days.

(21) Appl. No.: 13/271,247

(22) Filed: Oct. 12, 2011

(65) Prior Publication Data

US 2013/0043896 A1 Feb. 21, 2013

(30) Foreign Application Priority Data

Aug. 18, 2011 (CN) .......................... 2011 1 0237576

(51) Int. Cl.
*G01R 31/00* (2006.01)

(52) U.S. Cl.
USPC ................................... 324/756.01

(58) Field of Classification Search
USPC ............. 324/756.01, 763.01, 754.15, 750.25, 324/750.19
See application file for complete search history.

(56) References Cited

U.S. PATENT DOCUMENTS

| | | | | |
|---|---|---|---|---|
| 5,408,189 A | * | 4/1995 | Swart et al. | 324/750.22 |
| 5,894,225 A | * | 4/1999 | Coffin | 324/754.15 |
| 5,956,835 A | * | 9/1999 | Aksu | 29/468 |
| 6,054,869 A | * | 4/2000 | Hutton et al. | 324/754.15 |
| 6,900,648 B2 | * | 5/2005 | Ou et al. | 324/750.25 |
| 7,430,123 B2 | * | 9/2008 | Xiao et al. | 361/724 |
| 2004/0222784 A1 | * | 11/2004 | Ou et al. | 324/158.1 |

OTHER PUBLICATIONS

DimasTech "DimasTech Bench Tables V2.5", Jan. 2, 2010, http://www.xtremesystems.org/forums/showthread.php?242335-DimasTech-Bench-Tables-V2.5.*

Gabriel Torres, "Everything You Need to Know About the Motherboard Voltage Regulator Circuit", Feb. 10, 2010, HardwareSecrets.com, http://www.hardwaresecrets.com/printpage/Everything-You-Need-to-Know-About-The-Motherboard-Voltage-Regulator-Circuit/616.*

* cited by examiner

*Primary Examiner* — Jermele M Hollington
*Assistant Examiner* — Hoang X Nguyen
(74) *Attorney, Agent, or Firm* — Novak Druce Connolly Bove + Quigg LLP

(57) ABSTRACT

A test device for testing a printed circuit board (PCB) includes a base and a measuring device. The measuring device includes a testing pin and is capable of measuring any desired point of the PCB on condition that the pin makes contact with the point at an included angle between the pin and a back surface of the PCB which is larger than a predetermined angle. The distance between the base and the PCB satisfies: $H > L \tan\theta$, where H is the vertical distance between the PCB and the base, L is the maximum length of an orthogonal projection of the pin on the PCB when the pin is contacting the point, and $\theta$ is the predetermined angle.

3 Claims, 6 Drawing Sheets

TEST DEVICE FOR PRINTED CIRCUIT BOARD

BACKGROUND

1. Technical Field

The present disclosure relates to test devices and, particularly, to a test device facilitating the measurement of points located on opposite surfaces of a printed circuit board (PCB).

2. Description of Related Art

After being assembled, motherboards need to be tested to ensure quality. In detail, some tests need to carry out measurements on some points locating on a front surface of the motherboard while some other tests need to make contact with other points located on a back surface of the motherboard. However, during the measurements, the motherboard is often required to be steadily supported on a platform to provide better measurement conditions and one of the front surface and the back surface is typically shielded by the platform. As such, some points to be measured are inaccessible to the pins of measuring devices. The motherboard need to be turned over to finish the measurement of all the points, which is inconvenient and inefficient.

Therefore, it is desirable to provide a test device, which can overcome the above-mentioned problems.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Figure 1:
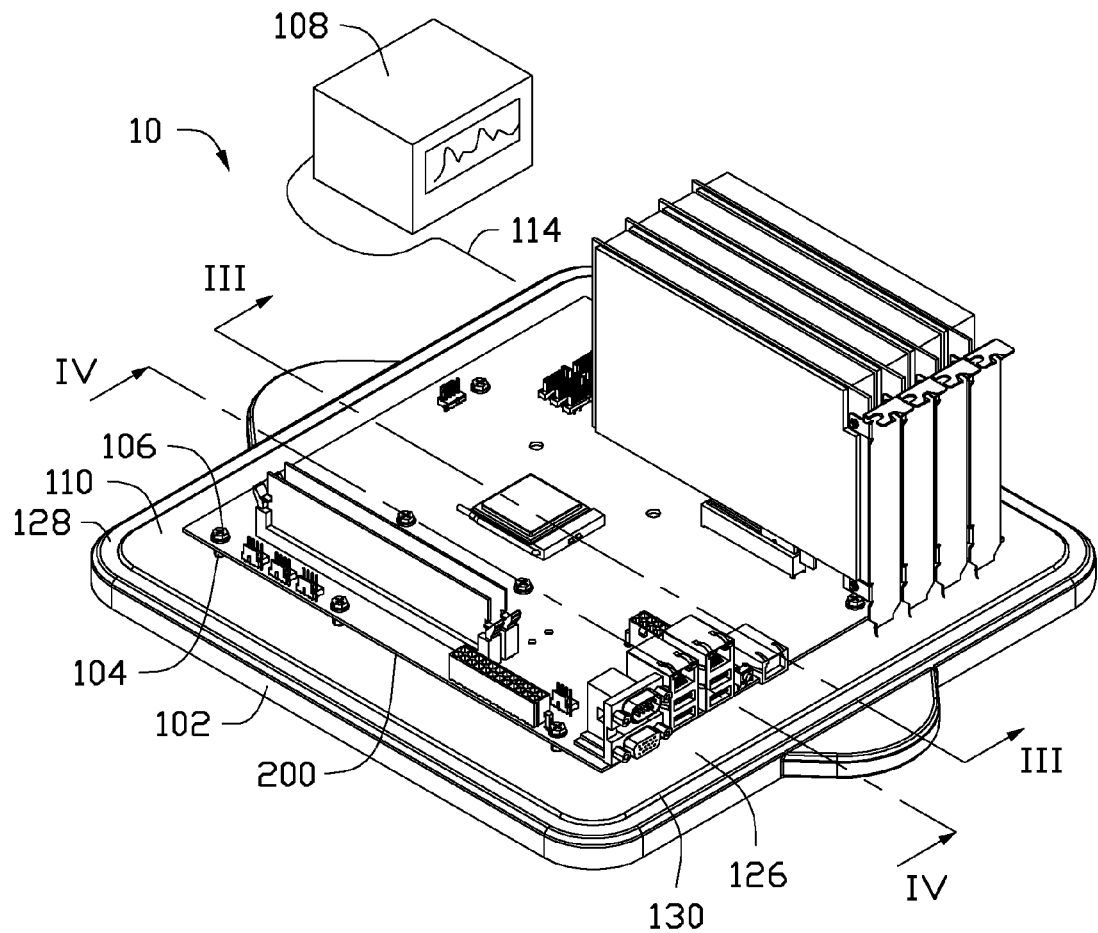
FIG. 1 is an isometric schematic view of an assembled test device and a PCB under test, according to an embodiment.
Figure 2:
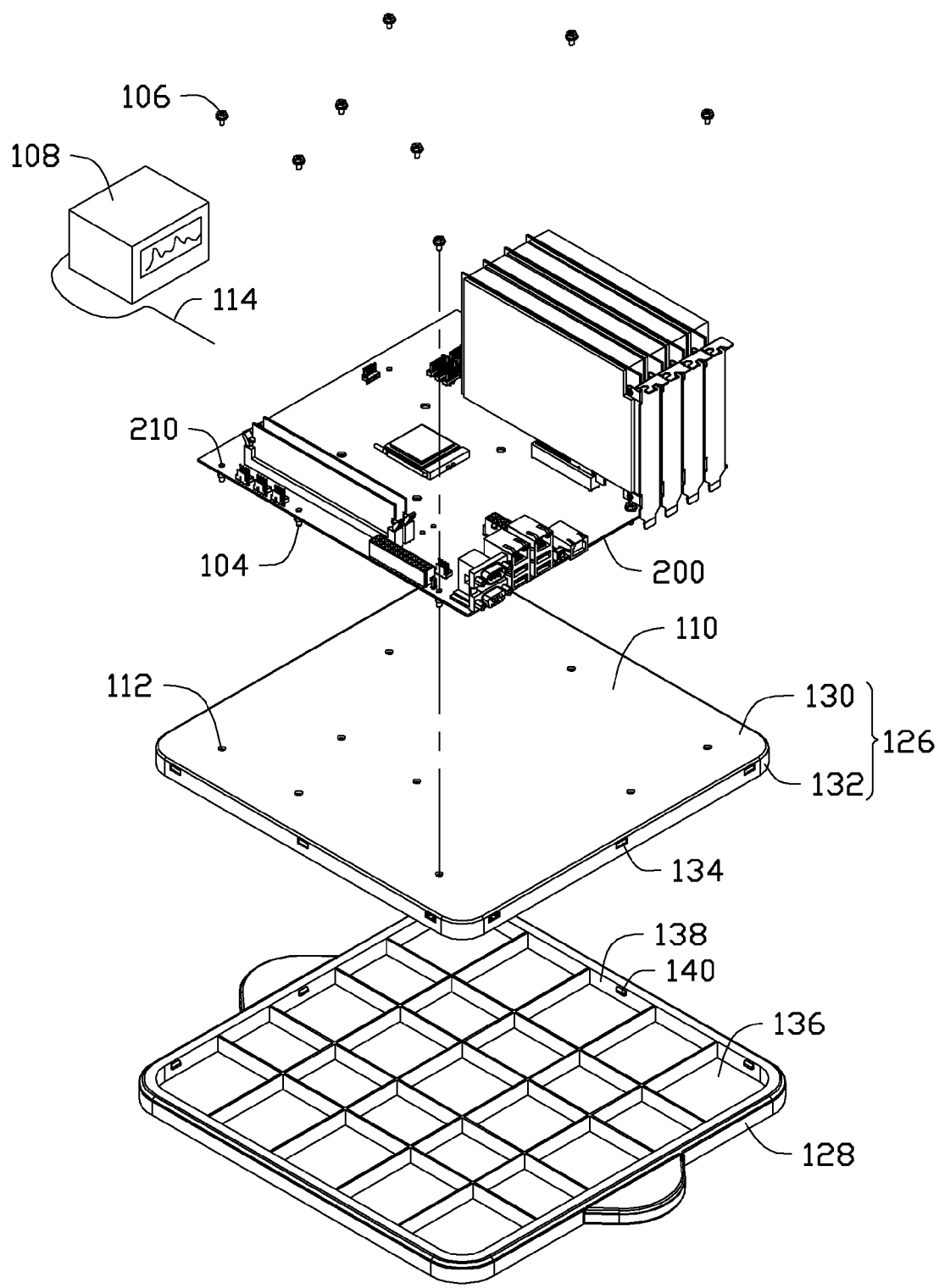
FIG. 2 is similar to FIG. 1, but is exploded.
Figure 3:
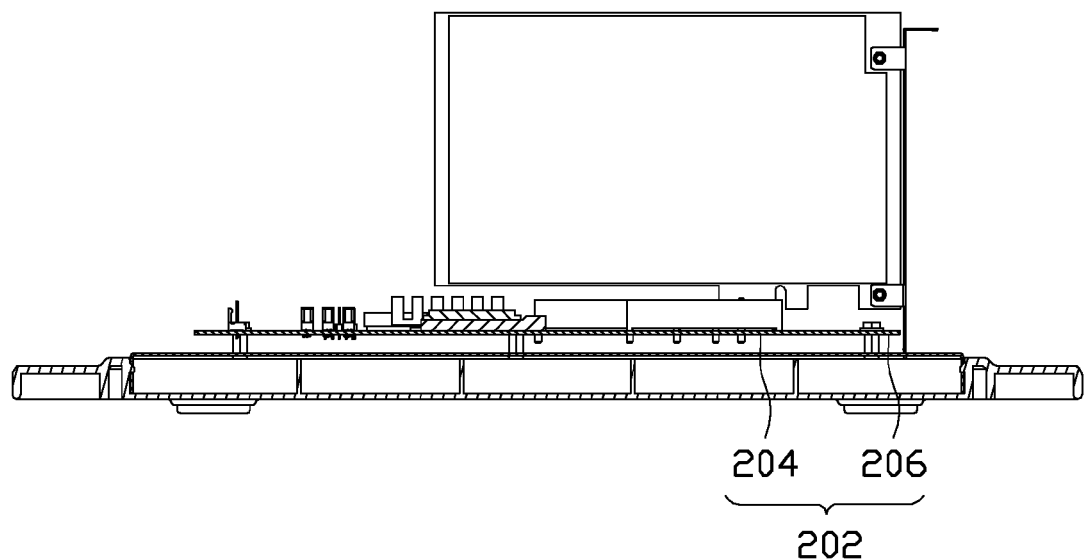
FIG. 3 is a cross-sectional view taken along a line III-III of FIG. 1.
Figure 4:
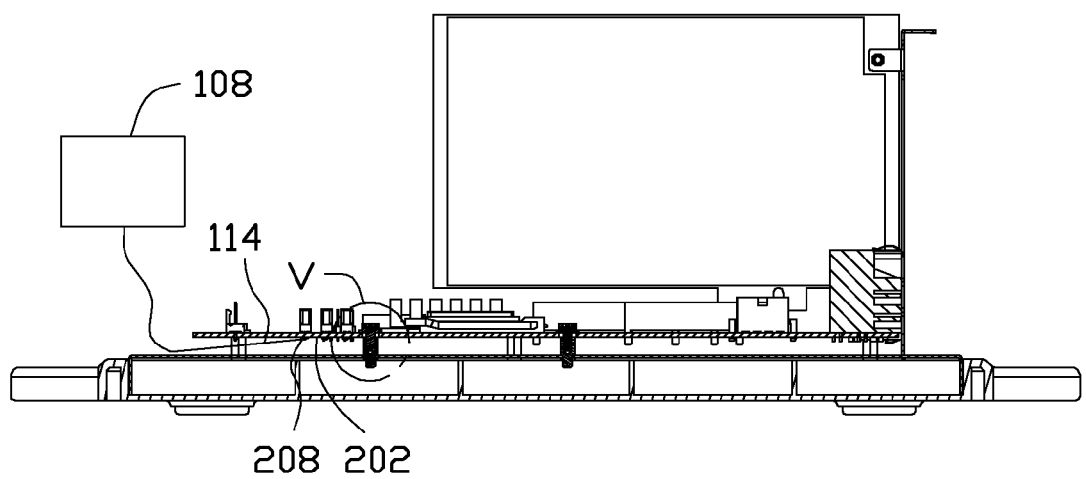
FIG. 4 is a cross-sectional view taken along a line IV-IV of FIG. 1.

Embodiments of the present disclosure will now be described in detail with reference to the drawings.

Referring to FIGS. 1-4, a test device 10, which is configured to test a PCB 200, according to an embodiment is shown.

The PCB 200 includes a back surface 202. The back surface 202 includes a circuited region 204 and a non-circuit region 206. The circuited region 204 contains a point 208 to be measured in the testing of the PCB 200. The PCB 200 defines nine through holes 210 in the non-circuit region 206.

The test device 10 includes a base 102, nine bolt sleeves 104, nine bolts 106, and a measuring device 108. The base 102 includes a supporting surface 110 and defines nine first threaded holes 112 in the supporting surface 110, arranged to correspond to the through holes 210 in position and size. The PCB 200 is fixed to the base 102 by the bolts 106, the through holes 210, the bolt sleeves 104, and the first threaded holes 112. The back surface 202 faces the supporting surface 110 and is suspended above it by the bolt sleeves 104 interposed therebetween. The measuring device 108 includes a pin 114 and can measure the point 208 only when the pin 114 is in contact with the point 208 and when the included angle between the pin and the back surface 202 is greater than a predetermined angle. If the included angle is smaller than the predetermined angle, the pin 114 will unavoidably contact the back surface 202 at more than one point. As such, the measuring device 108 can not operate in a reliable manner. The setting of the predetermined angle is determined in part by the shape of the head of the pin 114 and the diameter of the pin 114.

The distance between the back surface 202 and the supporting surface 110 satisfies: H>L tan θ, wherein H is the distance between the back surface 202 and the supporting surface 110, L is the maximum length of the orthogonal (or orthographic) projection of the pin 114 on the back surface 202 when the pin 114 is contacting the point 208, and θ is the predetermined angle.

Figure 6:
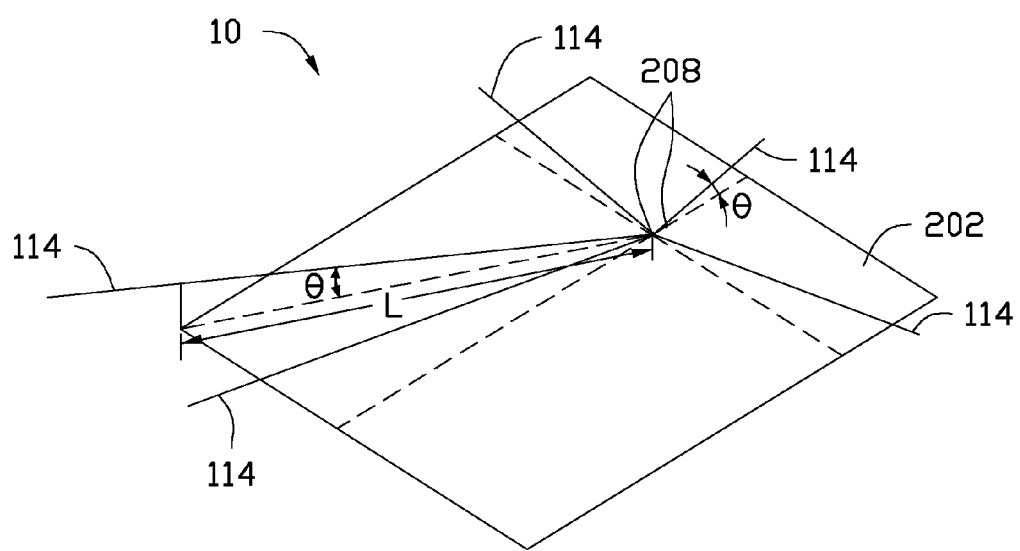
FIG. 6 is a schematic view showing an operating principle of the test device of FIG. 1.

FIG. 6 schematically shows an operating principle of the test device 10. In FIG. 6, two points 208 are exemplarily formed on the back surface 202. The pin 114 contacts one of the points 208 and an included angle between the pin 114 and the back surface 202 is substantially equal to the predetermined angle θ to avoid the pin 114 simultaneously contacting the other point 208. When the pin 114 rotates about a direction that is perpendicular to the back surface 202 while contacts the point 208 under measurement, orthogonal projections of the pin 114 of varying lengths (shown as the dashed lines) are formed on the back surface 202 and L is the length of the longest orthogonal projection of the pin 114 on the back surface 202. As such, provided that the back surface 202 is spaced away from the base 102 at the distance larger than L tan θ, the pin 114 can be inserted between the PCB 200 and the base 102 in any direction and contacts the point 108 to be measured with an included angle larger than the predetermined angle θ.

The space between the back surface 202 and the supporting surface 110 allows the insertion of the pin 114 and contact with the point 208, with the included angle between the pin 114 and the back surface 202 greater than the predetermined angle. Therefore, the measuring device 110 can successfully measure the point 208 without the need to turn over the PCB 200.

If the back surface 202 presents more than one point 208 to be measured, then L will represent the maximum length of the orthogonal projection of the pin 114 on the back surface 202 when the pin 114 is in contact with any one of the points 208. As such, the measurement device can successfully measure any one and all of the points 208.

In this embodiment, the PCB 200 is a computer motherboard. The PCB also includes a surface that faces away from the back surface 202 and presents other points which need to be measured. These points are completely open and therefore can be readily measured by placing the pin 114 thereon. The point 208 can be a via (hole), a pin(s) of a chip, or a connection pad. The measuring device 108 may be an oscilloscope or a digital multimeter.

The number of the through holes 210, the bolt sleeves 104, the bolts 106, and the first threaded hole 112 is not limited to nine but can be any number of three or more depending on requirements.

Figure 5:
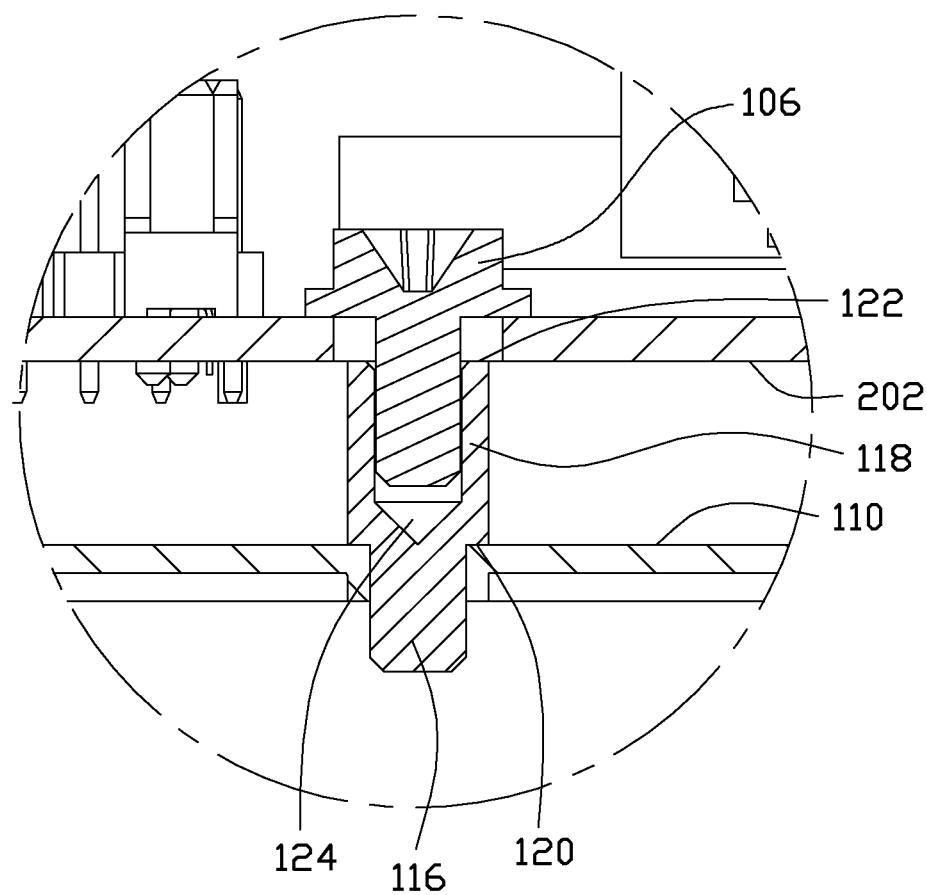
FIG. 5 is an enlarged view of the portion V of FIG. 4.

Referring to FIG. 5, each bolt sleeve 104 includes a threaded columnar section 116 engaging with a first threaded hole 112 and a sleeve section 118 extending from an end of the columnar section 116. The diameter of each columnar section 116 is smaller than the outer diameter of the sleeve section 118, thereby forming a stepped surface 120 between each columnar section 116 and the sleeve section 118. Each sleeve section 118 defines a second threaded hole 124 in a surface 122 to match with a bolt 106. The outer diameter of each sleeve section 118 is greater than the diameter of any through hole 210.

In assembly, each columnar section 116 is screwed into a first threaded hole 112 until the stepped surface 120 abuts the supporting surface 110, so fixing the bolt sleeve 104 to the base 102 with the sleeve section 118 locating above the supporting surface 110.

The bolts 106 are inserted through the through holes 210 and then screwed into the second threaded holes 124 to fix the PCB 200 on the bolt sleeves 104. The surfaces 122 abut the back surface 202, so that the distance between the back surface 202 and the supporting surface 110 is substantially equal to the length of the sleeve section 118.

In this embodiment, the base 102 includes a cover 126 and a bottom plate 128. The cover 126 is made of rigid material such as steel and includes a supporting plate 130 and an outer sidewall 132 extending down from the edges of the supporting plate 130. The outer sidewall 132 defines a number of engaging grooves 134. The bottom plate 128 is made of tough, but non-rigid and non-slip material such as plastic and defines a receiving groove 136 that can fittingly receive the cover. The receiving groove 136 is bounded by an inner sidewall 138. The bottom plate 128 also includes a number of engaging protrusions 140 extending inwards from the inner sidewall 138 and corresponding to the engaging grooves 134. The first threaded holes 112 are defined in the supporting plate 130. This configuration can improve the wear resistance of the first threaded holes 112 and the lifelong precision due the rigid material of the cover 126.

In assembly, the cover 126 is pushed into the receiving groove 136 until the engaging protrusions 140 snap into the respective engaging grooves 134.

The above particular embodiments are shown and described by way of illustration only. The principles and the features of the present disclosure may be employed in various and numerous embodiments thereof without departing from the scope of the disclosure as claimed. The above-described embodiments illustrate the possible scope of the disclosure but do not restrict the scope of the disclosure.

What is claimed is:

1. A test device, comprising:
   a base comprising a supporting surface for supporting a printed circuit board (PCB), the PCB comprising a back surface facing the supporting surface, the back surface comprising a circuited region and a non-circuit region, the circuited region forming a point, the PCB defining at least three through holes in the non-circuit region, the base defining at least three first threaded holes in the supporting surface corresponding to the through holes;
   at least three bolt sleeves for being interposed between the supporting surface and the back surface and engaging with the respective first threaded holes;
   at least three bolts for inserting through the respective through holes and the respective bolt sleeves, fastening the PCB to the supporting surface; and
   a measuring device comprising a pin inserting between the base and the PCB and capable of measuring the point upon a condition that the pin contacts the point and an included angle between the pin and the back surface larger than a predetermined angle,
   wherein if the included angle is smaller than the predetermined angle, the pin contacts the back surface at more than one point to cause the measuring device operating in an unreliable manner;
   the distance between the supporting surface and the back surface satisfying:

$H > L \tan \theta$, where H is the distance between the back surface and the supporting surface, L is the maximum length of the orthogonal projection of the pin on the back surface when the pin contacts the point and rotates about a direction that is perpendicular to the back surface, and θ is the predetermined angle.

2. The test device of claim 1, wherein each bolt sleeve comprises a columnar section engaging with a corresponding first threaded hole and a sleeve section extending from an end of the columnar section along an axial direction of the columnar section, the diameter of each columnar section is smaller than the outer diameter of the corresponding sleeve section, forming a stepped surface between each columnar section and the corresponding sleeve section and abutting the supporting surface, each sleeve section defines a second threaded hole in a surface opposite to the corresponding columnar section, the outer diameter of each sleeve section is larger than the diameter of the corresponding through hole, and the sleeve section contacts the back surface.

3. The test device of claim 1, wherein the base comprises a cover and a bottom plate, the cover is made of rigid material and includes a rectangular supporting plate and an outer sidewall extending downward from the edge of the supporting plate, the outer sidewall defines a plurality of engaging grooves, the bottom plate is made of nonrigid material and defines a receiving groove fittingly receiving the cover, the receiving groove is bounded by an inner sidewall, the bottom plate comprises a plurality of engaging protrusions extending from the inner sidewall and correspondingly engaging with the engaging grooves.

* * * * *